United States Patent [19]

Kobayashi et al.

[11] Patent Number: 5,069,724
[45] Date of Patent: Dec. 3, 1991

[54] METHOD OF CLEANING CARBON MEMBER CONTAMINATED WITH INORGANIC DEPOSITS

[75] Inventors: Yoshiyuki Kobayashi, Ube; Takashi Suehaga, Yamaguchi; Isamu Mouri; Tukasa Fujii, both of Ube, all of Japan

[73] Assignee: Central Glass Company, Limited, Ube, Japan

[21] Appl. No.: 548,412

[22] Filed: Jul. 5, 1990

[30] Foreign Application Priority Data

Jul. 10, 1989 [JP] Japan ................................ 1-177384

[51] Int. Cl.$^5$ ................................ B08B 5/00
[52] U.S. Cl. ................................ 134/37; 134/21; 134/30; 156/646; 423/460
[58] Field of Search ................................ 134/21, 30, 37; 156/646; 423/460

[56] References Cited

FOREIGN PATENT DOCUMENTS

| 3625597 | 5/1987 | Fed. Rep. of Germany . |
| 64-17857A | 7/1987 | Japan . |
| 6417857 | 1/1989 | Japan . |
| 1-152274A | 6/1989 | Japan . |
| 231936 | 9/1989 | Japan . |
| 1268377 | 3/1972 | United Kingdom . |

OTHER PUBLICATIONS

J. G. Gualtieri, M. J. Katz, and G. A. Wolff, "Gas Etching and its Effect on Semiconductor Surfaces" (U.S. Army Signal Research and Develop-Lab), Chemical Abstract, vol. 54, No. 22, 1960, p. 23761.

*Primary Examiner*—Theodore Morris
*Assistant Examiner*—Zeinab El-Arini
*Attorney, Agent, or Firm*—Fleit, Jacobson, Cohn, Price, Holman & Stern

[57] ABSTRACT

Carbon members contaminated with deposits of metals and/or metal compounds such as nitrides or carbides are thoroughly cleaned with little adverse influences on the carbon members themselves by treating the contaminated carbon members with a cleaning gas consisting of 1-20 vol % of $ClF_3$ gas and the balance of an inactive diluent gas at a temperature in the range from 200° to 300° C. For example, this cleaning method is applicable to graphite parts of apparatus for forming thin films in the manufacture of semiconductor devices.

10 Claims, 2 Drawing Sheets

METHOD OF CLEANING CARBON MEMBER CONTAMINATED WITH INORGANIC DEPOSITS

BACKGROUND OF THE INVENTION

This invention relates to a method of cleaning a carbon member contaminated with deposits of metals and/or metal compounds without adversely affecting the carbon body by using a cleaning gas containing a halogen compound gas. The carbon member itself is not limited and, for example, may be a graphite part of an apparatus for forming thin films in the manufacture of semiconductor devices.

In conventional processes for forming thin films for semiconductor devices such as PVD, CVD, vacuum evaporation and epitaxy processes it is almost inevitable that various parts of the apparatus and jigs are contaminated by the deposition of metals and/or some metal compounds such as carbides or nitrides. Therefore, it is necessary to periodically clean the contaminated parts by removing the deposits. For this purpose, conventional cleaning methods include chemical cleaning methods using a strong acid or a strong alkali, mechanical cleaning methods by grinding or the like and plasma etching methods using a fluorine compound gas such as $CF_4$, $SF_6$ or $NF_3$.

However, the conventional cleaning methods involve various problems. In the case of cleaning with a strong acid or a strong alkali the cleaning operation is troublesome, and it is necessary to interrupt the operation of the apparatus for a relatively long period of time, and the parts or jigs subjected to cleaning are liable to be damaged. Mecanical cleaning methods such as grinding have similar disadvantages. In the case of cleaning by plasma etching using a fluorine compound as the etching gas the need of producing a plasma atmosphere places strict restrictions on the cleaning apparatus. Besides, when the parts to be cleaned are made of graphite or carbon in different form there occurs vigorous fluorination reaction between carbon and fluorine radical generated in the plasma atmosphere, so that the etching of the deposits is accompanied by erosion of the carbon surfaces.

SUMMARY OF THE INVENTION

It is an object of the invention to provide a method of cleaning a carbon member contaminated with deposits of metals and/or metal compounds, without eroding or otherwise adversely affecting the carbon member.

According to the invention there is provided a method of cleaning a carbon member contaminated with inorganic deposits, the method comprising bringing a cleaning gas into direct contact with the contaminated carbon member at a temperature in the range from about 200° C. to about 300° C., the cleaning gas consisting essentially of 1–20 vol % of $ClF_3$ gas and the balance of an inactive diluent gas.

We have found that $ClF_3$ gas is very efficient as a cleaning or etching gas for removing metal and/or metal compound deposits on carbon surfaces, and that when appropriately diluted $ClF_3$ gas is used at a temperature within a specific range complete etching of the deposits is accomplished with little influence on the carbon member itself. When the cleaning treatment temperature is lower than 200° C. or higher than 300° C. the reaction between $ClF_3$ and carbon becomes significant, whereby an unwanted compound is formed on or in the carbon member. There is a possibility of using undiluted $ClF_3$ gas, but in that case the reactivity of the cleaning gas is too high and therefore it is difficult to determine an appropriate duration of the cleaning treatment for accomplishment of cleaning with little reaction between $ClF_3$ gas and the carbon member.

The cleaning method of the invention is applicable to various carbon members including, for example, graphite parts of apparatus for forming thin films in the manufacture of semiconductor devices, graphite jigs for the same purposes and graphite substrates. The type of "carbon" is not strictly limited. That is, the material of the member to be cleaned may be natural or synthetic graphite, pyrolytic carbon, partially graphitized carbon, ungraphitized carbon, or carbon fiber.

The constituents of the deposits to be removed by the method of the invention may be any of various metals such as W, Si, Ti, V, Nb, Ta, Se, Te, Mo, Re, Os, Ir, Sb and Ge, alloys of these metals, nitrides of these metals and carbides of these metals, or may be $SiO_x$ (x=2).

DETAILED DESCRIPTION OF THE INVENTION

Figure 1:
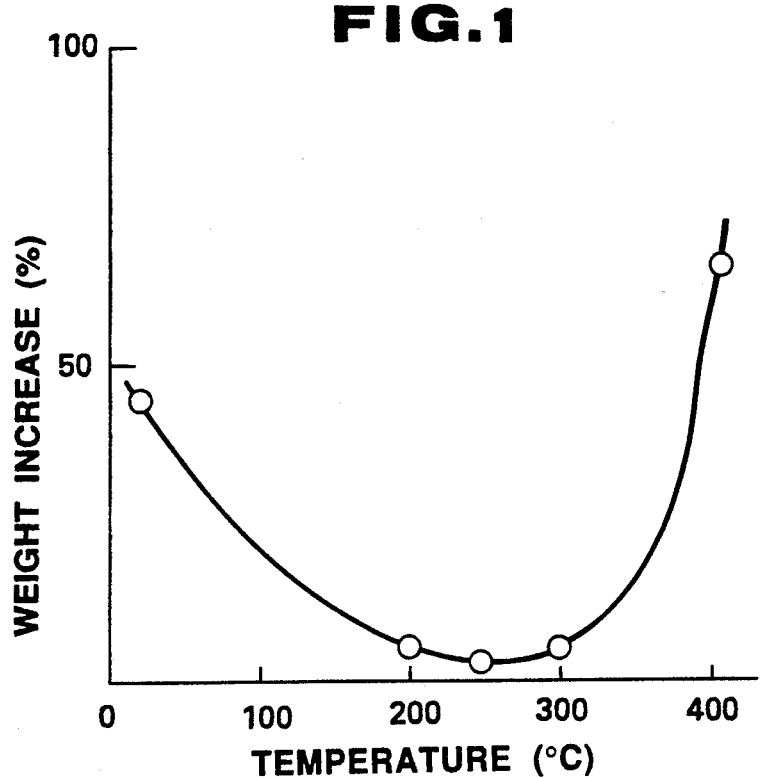
FIG. 1 is a graph showing the result of an experiment on the reactivity of $ClF_3$ gas with a graphite block with respect to the relationship between the $ClF_3$ gas treatment temperature and the amount of increase in the weight of the treated graphite block.

In this invention $ClF_3$ gas is employed exclusively as a reactive component of the cleaning gas. Other than $ClF_3$, we have found that $ClF$ and $ClF_5$ gas serves as a cleaning gas for deposits on carbon surfaces. However, with collective consideration of cleaning efficiencies and influences on carbon materials it is advantageous to use only $ClF_3$ gas together with a diluent gas. In some cases it is possible to mix a small amount of chlorine gas or fluorine gas with $ClF_3$ gas, but such mixing is not particularly preferable.

As to the diluent gas it is convenient to use argon, nitrogen or helium. In the cleaning gas consisting of $ClF_3$ gas and a diluent gas the concentration of $ClF_3$ gas must fall within the range from 1 to 20 vol %. If the concentration of $ClF_3$ is below 1 vol % it is not easy to etch the deposits, and the rate of etching is too low. On the other hand, even though the concentration of $ClF_3$ is above 20 vol % the deposits can be etched at high efficiency. However, when the concentration of $ClF_3$ is so high the cleaning operation is liable to be accompanied by considerable reaction of $ClF_3$ with carbon to result in the formation of an interlayer compound in carbon or graphite body, and it is difficult to prevent the unwanted reaction by suitably setting cleaning conditions. Besides, use of an unnecessarily large quantity of $ClF_3$ gas is unfavorable for the economy of the cleaning operation.

The cleaning operation is carried out at a temperature in the range from about 200° C. to about 300° C. If consideration is given only to the cleaning efficiency it is favorable to raise the cleaning temperature. However, as the cleaning temperature exceeds 300° C. the reaction of $ClF_3$ gas with carbon is gradually promoted. At relatively high temperatures the reaction of $ClF_3$ with carbon forms poly(carbon fluorodie), called graphite fluoride, which is a powdery substance so that a change occurs in the surface state of the carbon member subjected to cleaning. Also when the cleaning temperature is lower than 200° C. the reaction of $ClF_3$ with carbon becomes significant. In this case the reaction product is an interlayer compound which is a powdery substance and hence changes the surface state of the carbon member. In some cases it is possible to accomplish the cleaning at a temperature in the range from 100° to 200° C. or in the range from 300° to 350° C. without significantly affecting the carbon body, but in the present invention the cleaning temperature is limited within the range from about 200° C. to about 300° C. in order to minimize the influences on the carbon body.

In the cleaning operation the pressure of the cleaning gas is arbitrary. In practice, considering the safety of the operation it is suitable that the cleaning gas pressure is not higher than 1 atm.

In some cases small quantities of fluorine and chlorine remain in the carbon member subjected to the cleaning operation according to the invention. For complete removal of the remaining fluorine and chlorine it is very effective to bake the cleaned carbon member in the air at a temperature above about 350° C.

A cleaning operation according to the invention can be performed either by confining the contaminated carbon member and the cleaning gas in a vessel and heating the interior of the vessel or by keeping the contaminated carbon member heated in a stream of a heated cleaning gas.

REFERENTIAL TEST 1

This test was for examining the influence of pure $ClF_3$ gas on a graphite member.

A graphite block having a density of 1.87 g/cm³ was placed in a nickel vessel. In advance the weight of the graphite block was accurately measured. After evacuating the vessel, pure $ClF_3$ gas alone was introduced into the vessel until the gas pressure in the vessel reached 760 Torr. Then the temperature in the vessel was maintained at a predetermined level for 1 hr. The predetermined temperature was 20° C., 200° C., 250° C., 300° C. or 400° C. After this treatment the weight of the graphite block was measured to find a change in the weight resulting from the treatment with $ClF_3$ gas.

The results were as shown in FIG. 1. In every case there was an increase in the weight of the graphite block, but when the testing temperature was 200° C., 250° C. or 300° C. the amount of the amount of the weight increase was very small. The sample treated at 20° C. exhibited a nearly 50% increase in weight. By X-ray diffraction analysis of the treated graphite block the weight increase was attributed to the formation of an interlayer compound by the reaction of $ClF_3$ with graphite. The sample treated at 400° C. exhibited a still greater increase in weight. By X-ray diffraction analysis the formation of graphite fluoride was confirmed.

REFERENTIAL TEST 2

This test was made on the graphite block used in Referential Test 1. In this test a mixture of $ClF_3$ gas and argon gas was used in place of pure $ClF_3$ gas in Referential Test 1 to examine the influences of the concentration of $ClF_3$ in the mixed gas and the gas treatement temperature on the degree of reaction of the graphite block with $ClF_3$. The testing method was fundamentally the same as in Referential Test 1. The treatment temperature was 200° C., 250° C. or 300° C., and the concentration of $ClF_3$ in the mixed gas was 1 vol %, 10 vol % or 20 vol %. For comparison, pure $ClF_3$ gas was also used. In every case the gas pressure in the vessel was 500 Torr, and the treatment time was 1 hr.

The test results are shown in Table 1. When the concentration of $ClF_3$ gas was 20 vol % or below the amount of increase in the weight of the graphite block was less than 0.1%, i.e. within the range of errors in measurements, and there was little change in the state of the graphite block surfaces by observation with SEM.

TABLE 1

| Sample No. | Treatment Temperature (°C.) | Concentration of $ClF_3$ (vol %) | Weight Increase (%) |
|---|---|---|---|
| 1 | 200 | 100 | 2.6 |
| 2 | 200 | 10 | 0.1 |
| 3 | 200 | 1 | 0.1 |
| 4 | 250 | 100 | 0.8 |
| 5 | 250 | 20 | 0.1 |
| 6 | 250 | 10 | 0.1 |
| 7 | 250 | 1 | 0.1 |
| 8 | 300 | 100 | 1.1 |
| 9 | 300 | 10 | 0.1 |
| 10 | 300 | 1 | 0.1 |

EXAMPLE 1

Using graphite substrates 30 mm × 30 mm in widths, test-pieces were prepared by depositing a film of silicon nitride on the surface of each substrate to a thickness of 15000 Å by a plasma CVD process.

The silicon nitride film on each test-piece was etched by a stream of a mixed gas of $ClF_3$ and argon at a constant temperature ranging from 100° to 330° C. as shown in Table 2. The concentration of $ClF_3$ in the mixed gas was 1 vol %, 10 vol % or 20 vol %, and in every case the flow rate of the mixed gas was 1000 ml/min. The rate of etching of the silicon nitride film was measured with a two- and three-dimensional micromorphology measuring instrument of a noncontact type. The results are shown in Table 2. It is seen that the etching rate is fairly high even when the concentration of $ClF_3$ in the etching or cleaning gas is only 1 vol %.

TABLE 2

| Run No. | Treatment Temperature (°C.) | Concentration $ClF_3$ (vol %) | of Etching Rate (Å/min) |
|---|---|---|---|
| 1 | 250 | 20 | 2800 |
| 2 | 330 | 10 | 3000 |
| 3 | 200 | 10 | 1250 |
| 4 | 100 | 10 | 250 |
| 5 | 320 | 1 | 2300 |

TABLE 2-continued

| Run No. | Treatment Temperature (°C.) | Concentration ClF$_3$ (vol %) | of Etching Rate (Å/min) |
|---|---|---|---|
| 6 | 310 | 1 | 2000 |
| 7 | 200 | 1 | 200 |

EXAMPLE 2

On the test-piece prepared in Example 1, the etching treatment of Example 1 was made at 250° C. by using a mixed gas of 1 vol % of ClF$_3$ and the balance of argon. Before and after the etching treatment the contents of chlorine and fluorine in the test-piece were measured by fluorescent X-ray spectroscopy.

After the etching treatment the test piece was baked in a stream of air at 370° C. for 10 min. After that the contents of chlorine and fluorine were measured again. The results were as shown in Table 3.

TABLE 3

|  | Fluorescent X-ray Intensity (relative intensity) | | |
|---|---|---|---|
|  | before etching treatment | after etching treatment | after baking |
| Fluorine | 0.483 | 0.863 | 0.209 |
| Chlorine | 0.086 | 0.147 | not detected |

Thus, by the post-etching baking at 370° C. for 10 min the contents of fluorine and chlorine in the tested graphite substrate became lower than the levels before the etching treatment with ClF$_3$. After the baking the graphite substrate was used in a CVD process, and as a result a good film of silicon nitride was formed on the substrate without any problem.

EXAMPLE 3

Figure 2:
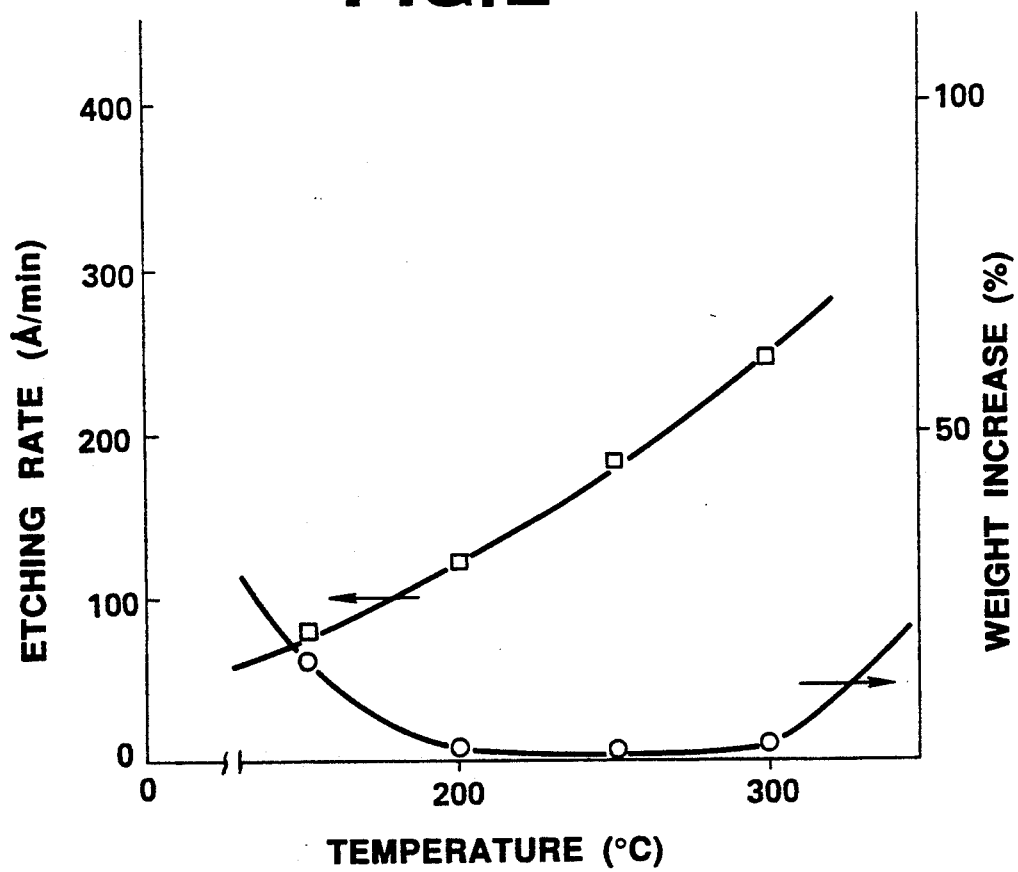
FIG. 2 is a graph showing the results of an example of the invention with respect to the dependence of the rate of etching of a silicon carbide film deposited on a graphite substrate and the amount of increase in the weight of the graphite substrate on the cleaning treatment temperature.

Test-pieces were prepared by depositing a film of silicon carbide having a thickness of 5 μm on graphite substrates by a plasma CVD process. The silicon carbide film on each test-piece was etched by the same method as in Example 1 by using a mixed gas consisting of 10 vol % of ClF$_3$ and the balance of argon. The etching treatment temperature was variable. With respect to the rate of etching of the silicon carbide film and the amount of increase in the weight of the graphite substrate the results were as shown in FIG. 2. When the etching was made at 200°-300° C. the etching rate was sufficiently high, and the amount of the weight increase was less than 0.1%.

EXAMPLE 4

Figure 3:
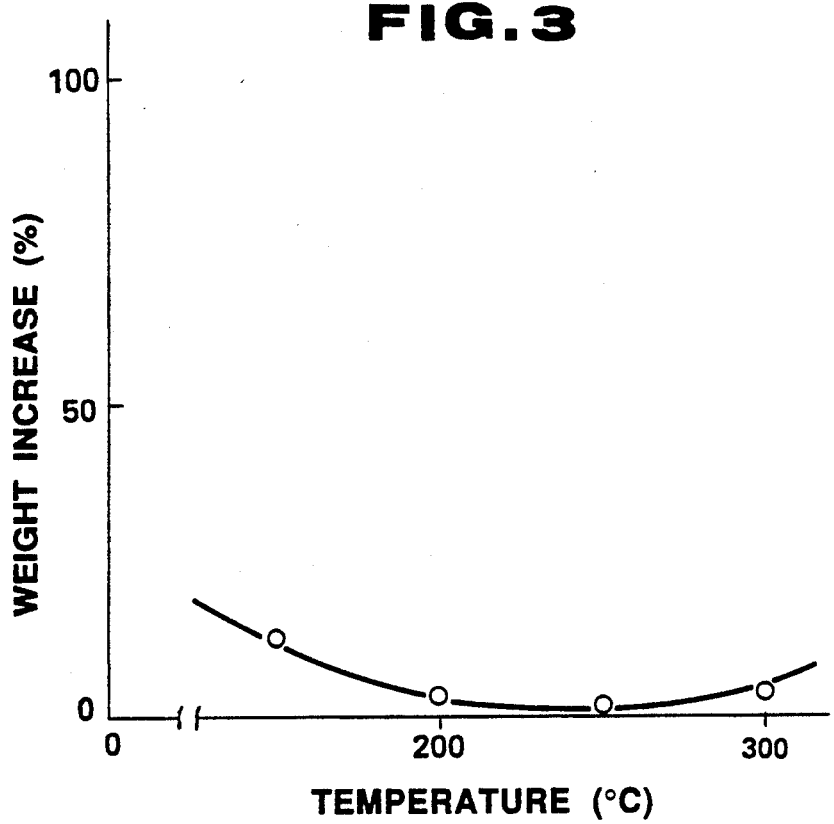
FIG. 3 is a graph showing the result of another example of the invention with respect to the relationship between the temperature at which a silicon film deposited on a graphite substrate was treated with a cleaning gas and the amount of increase in the weight of the substrate.

Test-pieces were prepared by depositing a film of amorphous silicon having a thickness of 1 μm on graphite substrates. The silicon film on each test-piece was etched by fundamentally the same method as in Referential Test 2 using a mixed gas consisting of 1 vol % of ClF$_3$ and the balance of argon. The gas pressure was 700 Torr, and the treatment temperature was variable. The relationship between the treatment temperature and the amount of increase in the weight of the graphite substrate was as shown in FIG. 3. When the etching was made at 200° C. the amorphous silicon film was etched at a rate of $1 \times 10^4$ Å/min.

EXAMPLE 5

Figure 4:
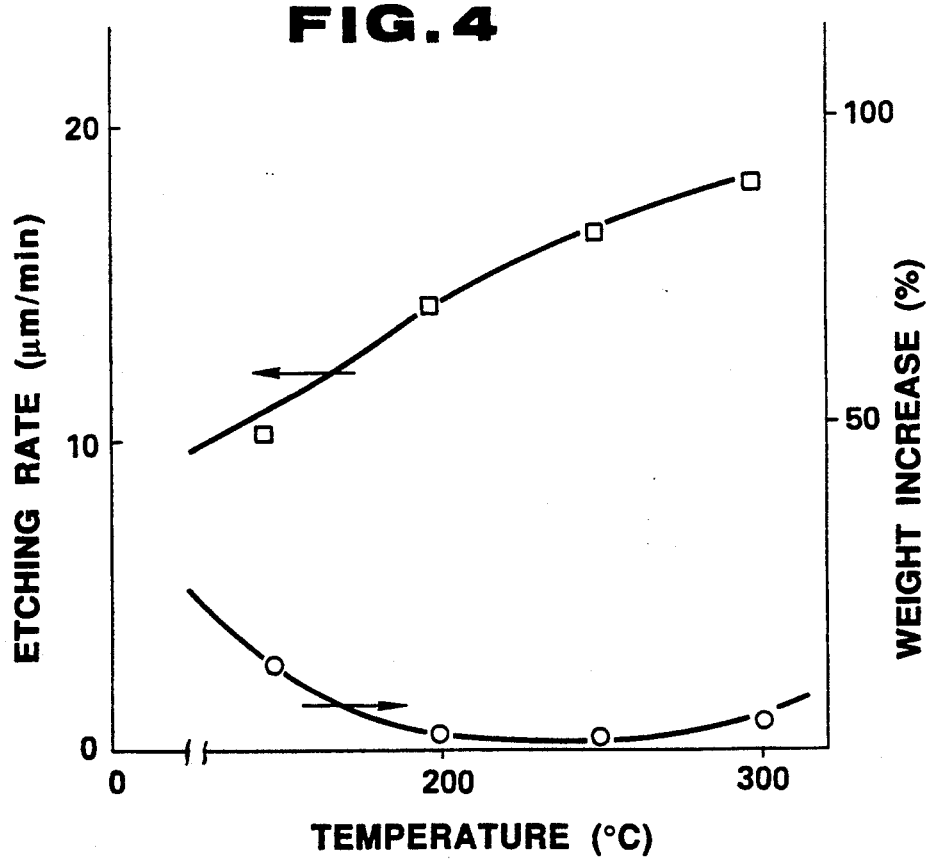
FIG. 4 is a graph showing the results of another example of the invention with respect to the dependence of the rate of etching of a tungsten film deposited on a graphite substrate and the amount increase in the weight of the substrate on the cleaning treatment temperature.

Test-pieces were prepared by depositing a tungsten film having a thickness of 5 μm on graphite substrates by a thermal CVD process. The tungsten film on each test-piece was etched by substantially the same method as in Referential Test 2 by using a mixed gas consisting of 10 vol % of ClF$_3$ and the balance of argon. The gas pressure was 700 Torr, and the treatment temperature was variable. With respect to the etching rate and the amount of increase in the weight of the graphite substrate the results were as shown in FIG. 4.

What is claimed is:

1. A method of cleaning a carbon member contaminated with inorganic deposits, the method comprising the step of bringing a cleaning gas into direct contact with the contaminated carbon member at a temperature in the range from about 200° C. to about 300° C., said cleaning gas consisting essentially of 1-20 vol % of ClF$_3$ gas and the balance of an inactive diluent gas.

2. A method according to claim 1, wherein the pressure of said cleaning gas is not higher than 1 atm.

3. A method according to claim 1, wherein a principal constituent of said deposits is a metal.

4. A method according to claim 1, wherein a principal constituent of said deposits is a metal nitride.

5. A method according to claim 1, wherein a principal constituent of said deposits is a metal carbide.

6. A method of cleaning a carbon member contaminated with inorganic deposits, comprising the steps of:
   a) bringing a cleaning gas into direct contact with the contaminated carbon member at a temperature in the range from about 200° C. to about 300° C., said cleaning gas consisting essentially of 1-20 vol % of ClF$_3$ gas and the balance of an inactive diluent gas; and
   b) baking the carbon member after the treatment with said cleaning gas in air at a temperature above about 350° C.

7. The method of claim 6, wherein the pressure of said cleaning gas is not higher than 1 atm.

8. The method of claim 6, wherein a principal constituent of said deposits is a metal.

9. The method of claim 6, wherein a principal constituent of said deposits is a metal nitride.

10. The method of claim 6, wherein a principal constituent of said deposits is a metal carbide.

* * * * *